US009184338B2

(12) United States Patent
Cho et al.

(10) Patent No.: US 9,184,338 B2
(45) Date of Patent: Nov. 10, 2015

(54) SEMICONDUCTOR DEVICE AND METHOD OF MANUFACTURING THE SAME

(75) Inventors: Meoung Whan Cho, Yongin (KR); Seog Woo Lee, Yongin (KR); Ryuichi Toba, Akita (JP); Yoshitaka Kadowaki, Akita (JP)

(73) Assignees: BBSA LIMITED, Hong Kong (CN); DOW ELECTRONICS MATERIALS CO., LTD., Tokyo (JP)

(*) Notice: Subject to any disclaimer, the term of this patent is extended or adjusted under 35 U.S.C. 154(b) by 0 days.

(21) Appl. No.: 14/347,443

(22) PCT Filed: Sep. 28, 2011

(86) PCT No.: PCT/JP2011/005485
§ 371 (c)(1),
(2), (4) Date: Apr. 28, 2014

(87) PCT Pub. No.: WO2013/046267
PCT Pub. Date: Apr. 4, 2013

(65) Prior Publication Data
US 2014/0284770 A1    Sep. 25, 2014

(51) Int. Cl.
*H01L 21/00* (2006.01)
*H01L 33/00* (2010.01)
*H01L 21/02* (2006.01)
*H01L 21/78* (2006.01)
*H01L 29/06* (2006.01)
*H01L 33/20* (2010.01)

(52) U.S. Cl.
CPC ...... *H01L 33/0075* (2013.01); *H01L 21/02365* (2013.01); *H01L 21/78* (2013.01); *H01L 29/0603* (2013.01); *H01L 33/0079* (2013.01); *H01L 33/20* (2013.01); *H01L 33/007* (2013.01)

(58) Field of Classification Search
CPC ............... H01L 33/0075; H01L 21/78; H01L 21/02365; H01L 29/0603; H01L 33/20
USPC .............................. 438/26, 29, 33, 42, 51, 68
See application file for complete search history.

(56) References Cited

U.S. PATENT DOCUMENTS

| | | | |
|---|---|---|---|
| 6,437,435 B1 * | 8/2002 | Kinsman et al. | 257/693 |
| 2003/0168720 A1 * | 9/2003 | Kamada | 257/666 |
| 2007/0290311 A1 * | 12/2007 | Hauenstein | 257/685 |
| 2008/0142809 A1 * | 6/2008 | Jang et al. | 257/76 |
| 2011/0127567 A1 * | 6/2011 | Seong | 257/99 |
| 2011/0254044 A1 * | 10/2011 | Kuo et al. | 257/99 |

FOREIGN PATENT DOCUMENTS

| | | |
|---|---|---|
| JP | A-2008-78275 | 4/2008 |
| JP | A-2011-187496 | 9/2011 |
| WO | WO 2011/055462 A1 | 5/2011 |

OTHER PUBLICATIONS

International Search Report issued in International Patent Application No. PCT/JP2011/005485 dated Dec. 27, 2011.

* cited by examiner

Primary Examiner — Hsien Ming Lee
(74) Attorney, Agent, or Firm — Oliff PLC

(57) ABSTRACT

The method of manufacturing a semiconductor device according to the present invention includes: a step of forming a semiconductor laminate on a growth substrate with a lift-off layer therebetween; a step of providing grooves in a grid pattern in the semiconductor laminate, thereby forming a plurality of semiconductor structures each having a nearly quadrangular transverse cross-sectional shape; a step of forming a conductive support body; and a step of removing the lift-off layer using a chemical lift-off process, in which step, in supplying an etchant to the grooves via through-holes provided in a portion above the grooves, the lift-off layer is etched from only one side surface of each semiconductor structure.

13 Claims, 11 Drawing Sheets

FIG. 1B
(d)
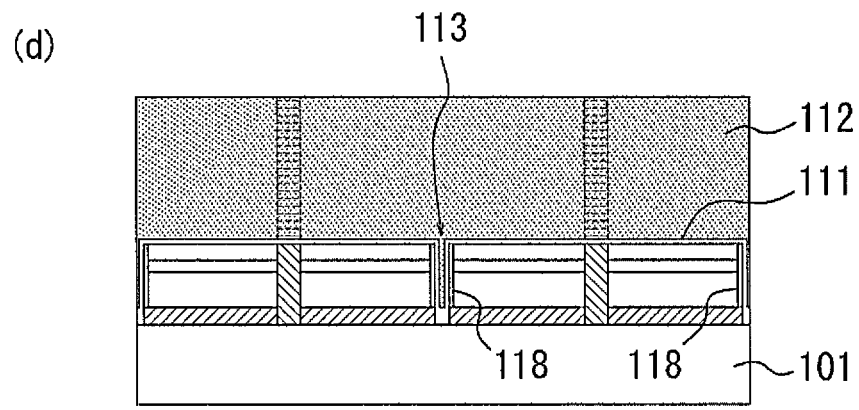
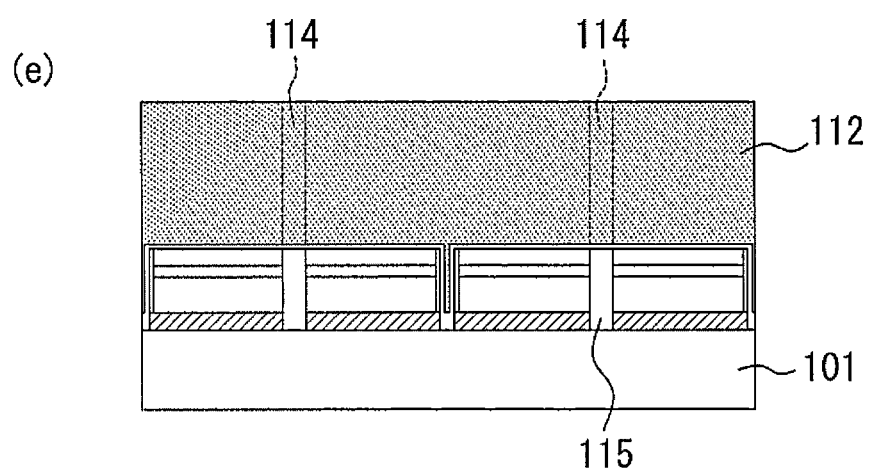
(e)

FIG. 2A
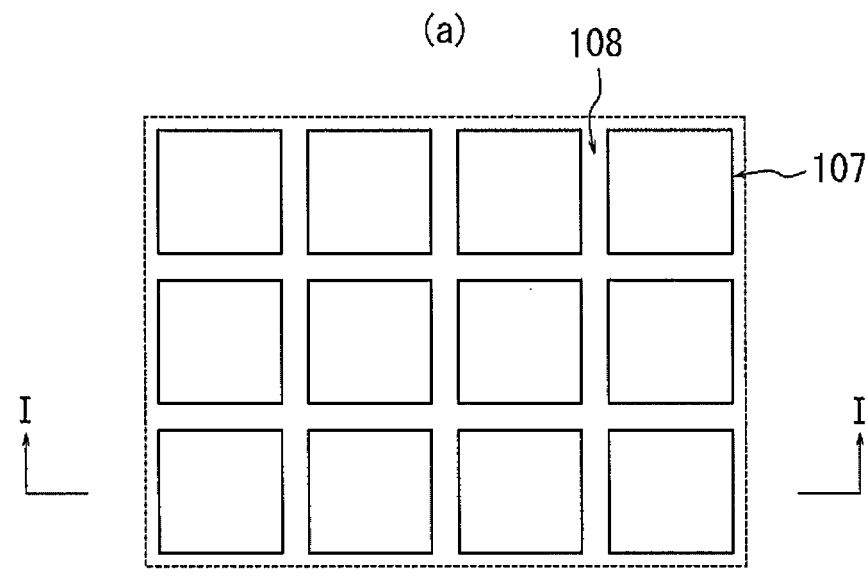
(a)
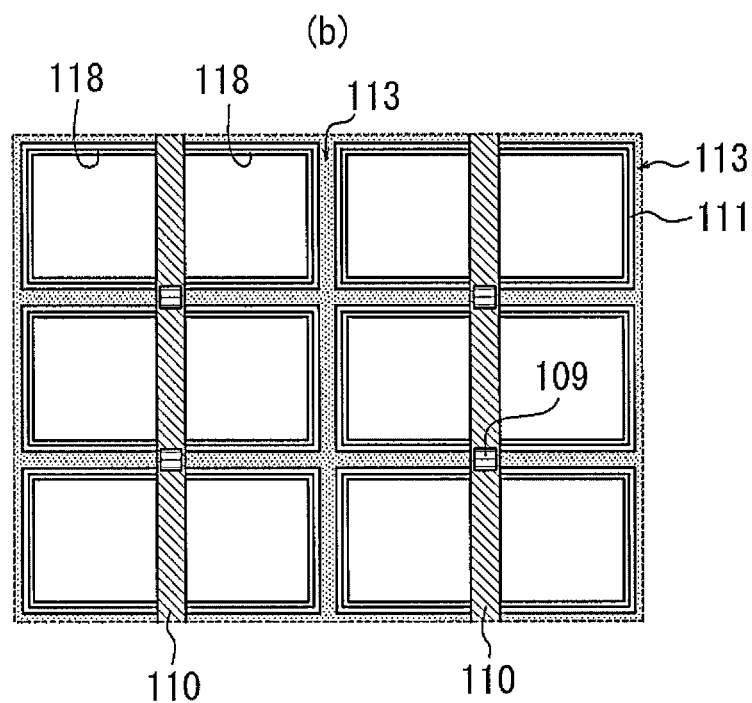
(b)

FIG. 2B
(c)
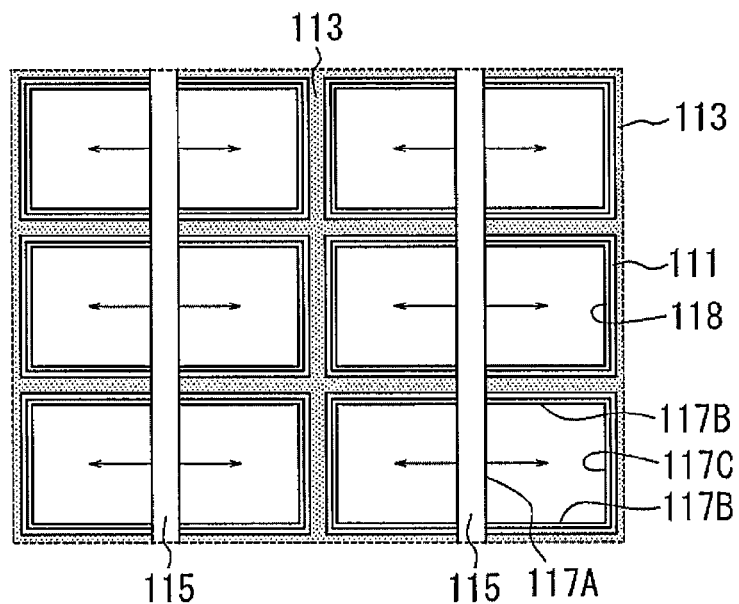
(d)
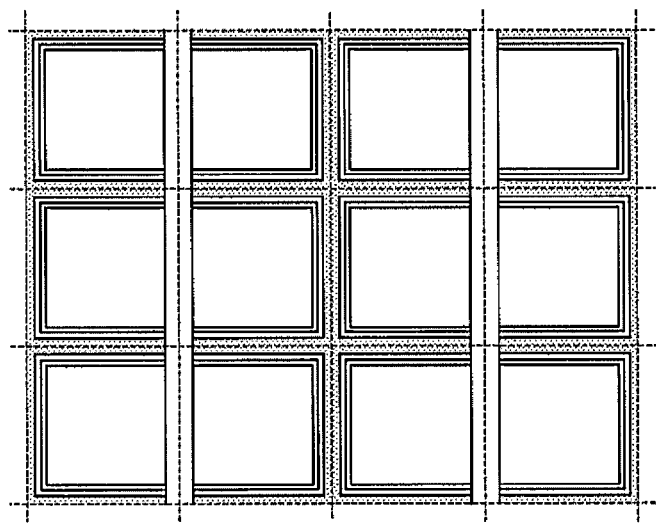

FIG. 7
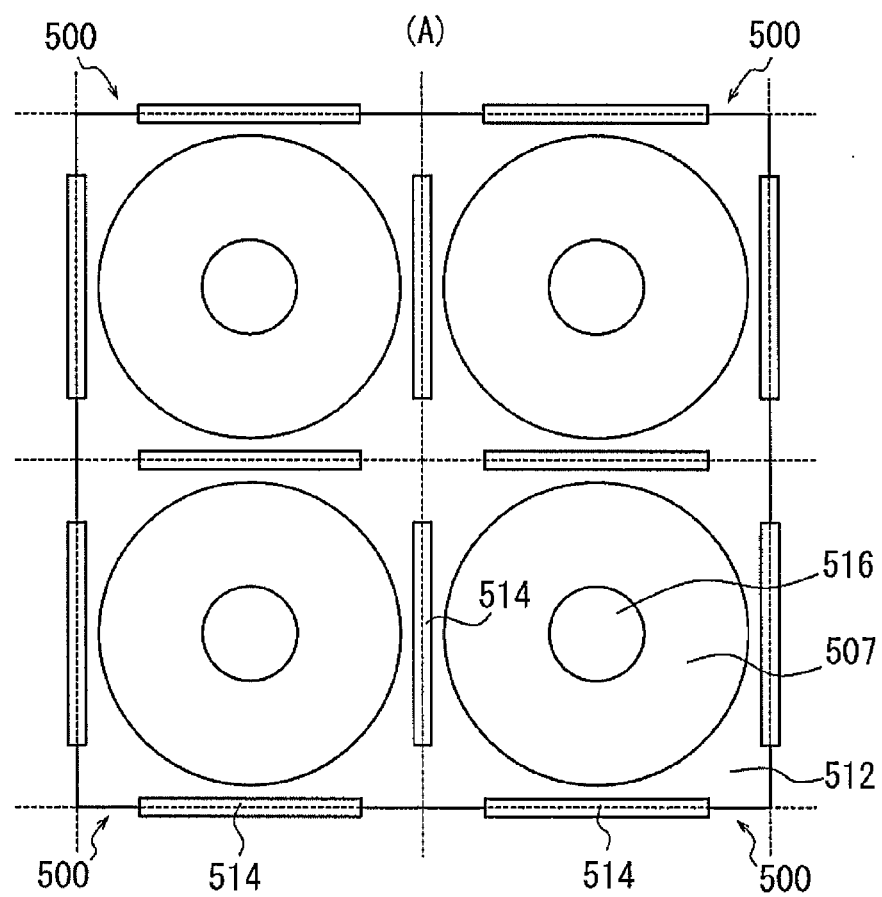
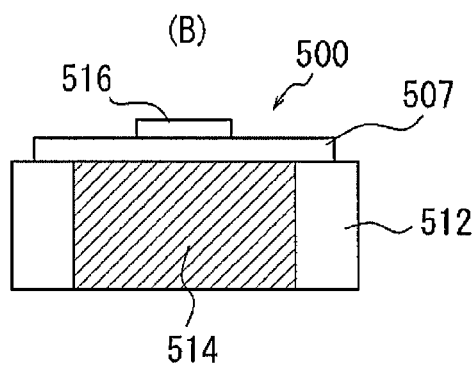

FIG. 8
(A)
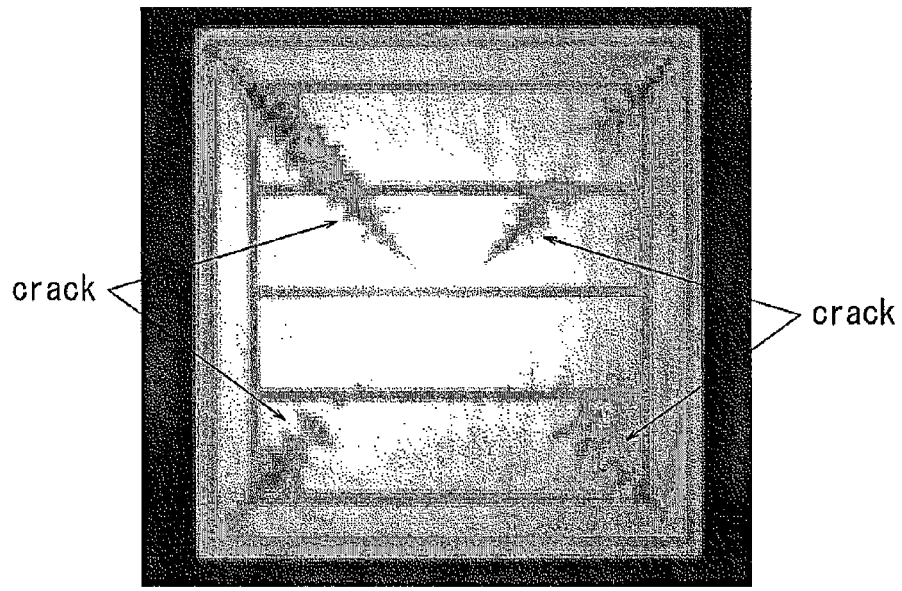
(B)
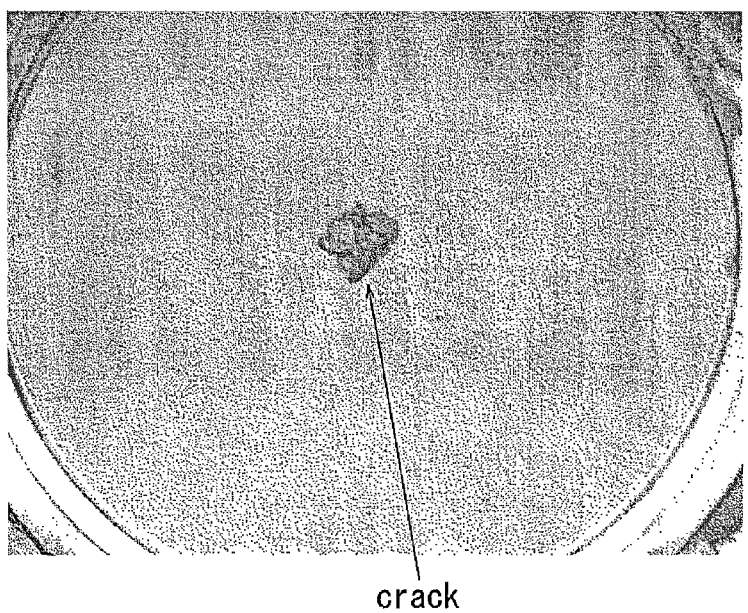

SEMICONDUCTOR DEVICE AND METHOD OF MANUFACTURING THE SAME

TECHNICAL FIELD

The present invention relates to a semiconductor device and a method of manufacturing the same.

BACKGROUND ART

Examples of semiconductor devices include field effect transistors (FETs), light emitting diodes (LEDs), and the like. For LEDs, for example, Group III-V semiconductors made of compounds of Group III and Group V elements are used.

A Group III nitride semiconductor using Al, Ga, In, or the like as a Group III element and using N as a Group V element has a high melting point and a high dissociation pressure of nitrogen, which makes it difficult to perform bulk single crystal growth. Further, conductive single crystal substrates having large diameter are not available at low cost. Therefore, such a semiconductor is typically formed on a sapphire substrate.

However, since the sapphire substrate has insulating property, electric current does not flow in the substrate. Accordingly, a light emitting diode having a lateral structure in which electric current flows in a lateral direction has conventionally been used. This structure is obtained by partially removing a semiconductor laminate formed by sequentially growing an n-type Group III nitride semiconductor layer, an active layer (light emitting layer), and a p-type Group III nitride semiconductor layer on a sapphire substrate, to expose the n-type Group III nitride semiconductor layer, and providing an n-type electrode and a p-type electrode on the exposed n-type Group III nitride semiconductor layer and the p-type Group III nitride semiconductor layer, respectively.

On the other hand, in recent years, the following techniques for obtaining LED chips have been studied. After forming a buffer layer made of a certain element other than a Group III element (for example, Al, Ga, or the like) on a sapphire substrate, a semiconductor laminate including a light-emitting layer is formed. The semiconductor laminate is supported by a conductive support body, and then a sapphire substrate is separated (lifted off) by selectively dissolving the buffer layer by chemical etching. The conductive support body and the semiconductor laminate are sandwiched between a pair of electrodes. Note that a "buffer layer" herein is a buffer layer for epitaxial growth of a semiconductor laminate, which also serves as a lift-off layer for separating the semiconductor laminate from a sapphire substrate.

Examples of processes for manufacturing a III nitride semiconductor LED chip having such a structure include a typical chemical lift-off process in which a lift-off layer made of a metal other than Group III elements or a nitride of such metal is etched to separate an epitaxial layer from a sapphire substrate, or a photochemical lift-off process in which etching is performed while activating a lift-off layer by irradiation with light such as ultraviolet light. They are processes in which a lift-off layer is immersed in a certain solution thereby dissolving the lift-off layer to lift off an epitaxial layer from a growth substrate, and such processes are collectively referred to as "chemical lift-off processes" in this specification. An alternative expression may be "a growth substrate is lifted off from an epitaxial layer".

Here, a method of manufacturing vertically structured Group III nitride semiconductor LED chips that is described in PTL 1 (WO 2011/055462) will be explained with reference to FIGS. 6(A) to 6(F) and FIGS. 7(A) and 7(B). FIGS. 6(A) to 6(F) are schematic cross-sectional views illustrating the steps of a method of manufacturing conventional vertically structured Group III nitride semiconductor LED chips 500. First, a semiconductor laminate 503 is formed on a growth substrate 501 with a lift-off layer 502 therebetween by sequentially stacking a first conductivity type Group III nitride semiconductor layer 504, a light emitting layer 505, and a second conductivity type Group III nitride semiconductor layer 506, the second conductivity type being different from the first conductivity type (FIG. 6(A)). Next, the semiconductor laminate 503 and the lift-off layer 502 are partially removed to partially expose the growth substrate 501, thereby forming a plurality of separate semiconductor structures 507 are formed by partially removing the semiconductor laminate 503 (FIG. 6(B)). Subsequently, a conductive support body 512 is formed, which integrally supports the plurality of semiconductor structures 507 and also serves as a lower electrode (FIG. 6(C)). Further, the lift-off layer 502 is removed using a chemical lift-off process, thereby separating the growth substrate 501 from the plurality of semiconductor structures 507 (FIG. 6(D)). After that, upper electrodes 516 are formed on the separation side of the semiconductor structures 507 (FIG. 6(E)); finally, the conductive support body 512 is divided by cutting or the like along the broken lines shown in FIG. 7(A) between the semiconductor structures 507, thus singulating a plurality of LED chips 500 having the respective semiconductor structures 507 supported by the divided conductive support bodies 512A (FIG. 6(F)).

FIG. 7(A) is a schematic top view of a wafer in a state of FIG. 6(E) where the plurality of semiconductor structures which have not been singulated are formed. FIG. 6(E) is a cross-sectional view taken along a broken line in FIG. 7(A). FIG. 7(B) is a schematic side view of one of the LED chips 500 singulated along the broken lines in FIG. 7(A). Thus, in PTL 1, through-grooves 514 are provided along cut lines of the singulation (broken lines) in portions of the conductive support body 512 located between adjacent semiconductor structures 507. Accordingly, when the lift-off layer 502 is removed as in FIGS. 6(C) to 6(D), an etchant is supplied via the through-grooves 514 to surround the semiconductor structures 507. Further, the lift-off layer 502 right under the semiconductor structures 507 is etched from the outer peripheral portion of the semiconductor structures to the center portion thereof.

Here, in PTL 1, as shown in FIG. 7(A), the transverse cross section of the semiconductor structures 507 has a circular shape or a 4 n-gon shape ("n" is a positive integer) having rounded corners. If the transverse cross section of the semiconductor structures has a 4 n-gon shape without rounded corners, X-shaped cracks extending from the vicinity of the corners to the center portion would be formed in the individual semiconductor structures at a considerable rate after the lift-off as shown in FIG. 8(A). In PTL 1, the shape of the semiconductor structures is as described above, so that stresses can be prevented from being concentrated at the corners (the vectors of the etching proceeding from the periphery of the light emitting structures meet) during etching; thus, the formation of the above X-shape cracks can be prevented.

CITATION LIST

Patent Literature

PTL 1: WO 2011/055462

SUMMARY OF INVENTION

Technical Problem

However, according to further studies made by the inventors of the present invention, it has been found that in the method described in PTL 1, although cracks extending from the corners to the center of the individual semiconductor structures after lift-off can be effectively prevented, crack spots are newly formed at the center portion of the semiconductor structures at a considerable rate as shown in FIG. 8(B). The formation of such crack spots is not addressed as an issue in any published patent literature or professional literature. However, this is a critical issue to be solved for achieving mass production of vertically structured Group III nitride semiconductor LED chips. Further, this problem is a critical problem to be overcome in order to realize mass production of not only vertically structured Group III nitride semiconductor LED chips but also any semiconductor device manufactured using a chemical lift-off process.

In view of the above problem, it is therefore an object of the present invention to provide a high quality semiconductor device in which not only X-shape cracks extending from the vicinity of the corners of semiconductor structures to the center portion thereof, but also crack spots at the center portion can be prevented from being formed and to provide a method of manufacturing the semiconductor device.

Solution to Problem

In order to achieve the above object, the present invention primarily includes the following components.

(1) A method of manufacturing a semiconductor device, comprising: a first step of forming a semiconductor layer on a growth substrate with a lift-off layer therebetween; a second step of partially removing the semiconductor layer to form grooves in a grid pattern such that the growth substrate is partially exposed at the bottom of the grooves, thereby forming a plurality of semiconductor structures each having a nearly quadrangular transverse cross-sectional shape; a third step of forming a conductive support body for integrally supporting the plurality of the semiconductor structures; and a fourth step of removing the lift-off layer using a chemical lift-off process; a fifth step of dividing the conductive support body between the semiconductor structures thereby singulating a plurality of semiconductor devices having the respective semiconductor structures supported by the conductive support body, wherein in the fourth step, in supplying an etchant to the grooves via through-holes in the conductive support body, which through-holes provided in a portion above the grooves, the lift-off layer is etched from only one of the side surfaces of each of the semiconductor structures.

(2) The method of manufacturing a semiconductor device according to (1) above, wherein prior to the fourth step, the etchant is supplied only to the one side surface, which is firstly etched, of the four side surfaces of each semiconductor structure, and embedded parts inhibiting the etchant from being supplied to the other three side surfaces are formed in the grooves.

(3) The method of manufacturing a semiconductor device according to (2) above, wherein the conductive support body also serves as the embedded parts.

(4) The method of manufacturing a semiconductor device according to (3) above, wherein in the third step, the conductive support body is formed by plating.

(5) The method of manufacturing a semiconductor device according to (4) above, the third step comprising: a step of filling a space in each groove, where the embedded parts are not formed, with resin; a step of growing a conductive support body also serving as the embedded parts, by plating on surfaces of the semiconductor structures, on a surface of the resin, and at the exposed bottom of the grooves; a step of forming the through-holes in the conductive support body; and a step of removing the resin via the holes, thereby forming cavities in the portions of the grooves, wherein, in the fourth step, an etchant is supplied to the cavities in the grooves via the through-holes.

(6) The method of manufacturing a semiconductor device according to any one of claims 2 to 5, wherein the embedded parts are provided in the respective grooves so as to cover all of the said other three side surfaces of each semiconductor structure.

(7) The method of manufacturing a semiconductor device according to any one of claims 2 to 5, wherein the embedded parts are provided in the respective grooves so as to cover opposite two side surfaces of the said other three side surfaces of each semiconductor structure.

(8) A semiconductor device comprising a conductive support body and a semiconductor structure having a nearly quadrangular transverse cross-sectional shape, provided on part of the conductive support body, wherein the conductive support body covers three surfaces or opposite two surfaces of the four side surfaces of the semiconductor structure.

Advantageous Effect of Invention

According to the present invention, the lift-off layer is etched from only one side surface of each of the plurality of semiconductor structures, so that stresses are not concentrated at any part of the side surface of each semiconductor structure on the lift-off layer side in the process of removing the lift-off layer. As a result, it has become possible to provide a high quality semiconductor device in which not only X-shape cracks extending from the vicinity of the corners of semiconductor structures to the center portion thereof, but also crack spots at the center portion can be prevented from being formed and to provide a method of producing the semiconductor device.

BRIEF DESCRIPTION OF DRAWINGS

FIGS. 1B(d) and 1B (e) are vertical cross-sectional views schematically illustrating steps of a method of manufacturing the vertically structured Group III nitride semiconductor LED chips 100 according to an embodiment of the present invention, subsequent to the steps in FIGS. 1A(a) to 1A(c).

FIGS. 2A(a) and 2A (b) are transverse cross-sectional views schematically illustrating the states of FIG. 1A(b) and FIG. 1B(d), respectively.

FIGS. 2B(c) and 2B(d) are transverse cross-sectional views schematically illustrating the states of FIG. 1C(f) and FIG. 1C(g), respectively.

FIG. 7(A) is a schematic top view of a wafer in a state in FIG. 6(E) where the plurality of semiconductor structures which have not been singulated are formed, whereas FIG. 7(B) is a schematic side view of one of singulated LED chips 500 taken along the broken lines in FIG. 7(A).

FIG. 8(A) is a photograph showing cracks formed in a semiconductor structure of an LED chip obtained by another conventional manufacturing method, whereas FIG. 8(B) is a photograph showing a crack formed in an LED chip obtained by the conventional manufacturing method shown in FIG. 6 and FIG. 7.

DESCRIPTION OF EMBODIMENTS

Figure 1A:
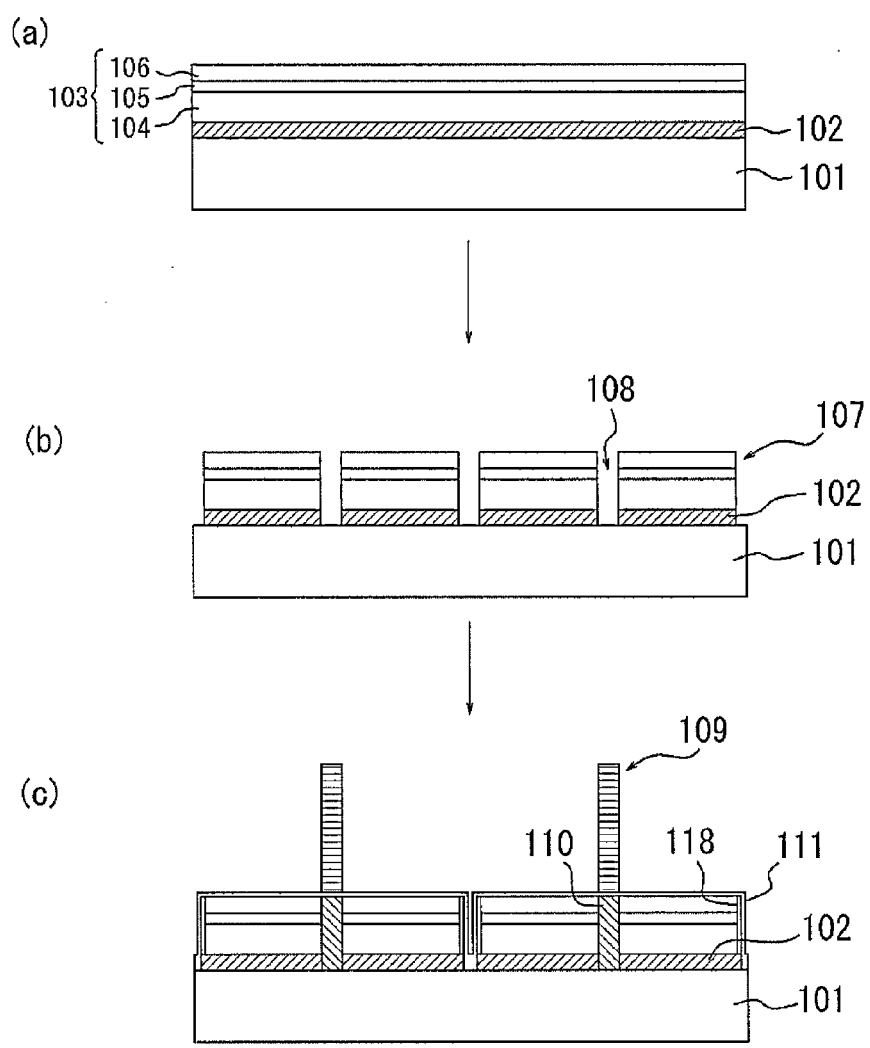
FIGS. 1A(a) to 1A(c) are vertical cross-sectional views schematically illustrating steps of a method of manufacturing vertically structured Group III nitride semiconductor LED chips 100 according to an embodiment of the present invention.

The present invention will be described in more detail, with reference to the accompanying drawings. In principle, components that are common to LED chips according to embodiments of the present invention are herein denoted by reference numerals having the same two last digits, and thus their descriptions will not be repeated. Further, in the schematic cross-sectional views of LED chips, the lift-off layer and the semiconductor laminate are enlarged for the sake of explanation; accordingly, the ratios between the illustrated components do not conform to the actual ratios.

A method of manufacturing vertically structured Group III nitride semiconductor LED chips (hereinafter, simply referred to as "LED chip") 100 according to an embodiment of the present invention will be described with reference to FIGS. 1A to 1C and FIGS. 2A and 2B. First, the correlation between FIGS. 1A to 1C and FIGS. 2A and 2B will be described. FIG. 2(a) is a transverse cross-sectional view of a light emitting layer 105 in a state shown in FIG. 1(b), whereas the cross section along line I-I in FIG. 2(a) corresponds to FIG. 1(b). Note that the cross-sectional views of other than FIG. 1(b) are of the same position. Further, the transverse cross-sectional views other than FIG. 2(a) are of the same position of the light emitting layer 105. FIG. 2(b) is a transverse cross-sectional view of the state shown in FIG. 1(d), which additionally shows the position of resin 109. FIG. 2(c) is a transverse cross-sectional view of the state shown in FIG. 1(f). FIG. 2(d) is a transverse cross-sectional view of the state shown in FIG. 1(g).

First, a first step is performed to form a semiconductor layer on a growth substrate with a lift-off layer therebetween. In this embodiment, first, as shown in FIG. 1A(a), a first conductivity type Group III nitride semiconductor layer 104, a light emitting layer 105, and a second conductivity type Group III nitride semiconductor layer 106 are sequentially stacked on a growth substrate 101 with a lift-off layer 102 therebetween to form a semiconductor laminate 103 as a semiconductor layer. The second conductivity type is opposite to the first conductivity type.

Next, as shown in FIG. 1(b) and FIG. 2(a), a second step is performed to partially remove the semiconductor laminate 103 so as to form grooves 108 in a grid pattern such that the growth substrate 101 is partially exposed at the bottom of the grooves, thereby forming a plurality of semiconductor structures 107 having a quadrangular transverse cross-sectional shape that are isolated like islands.

Figure 1C:
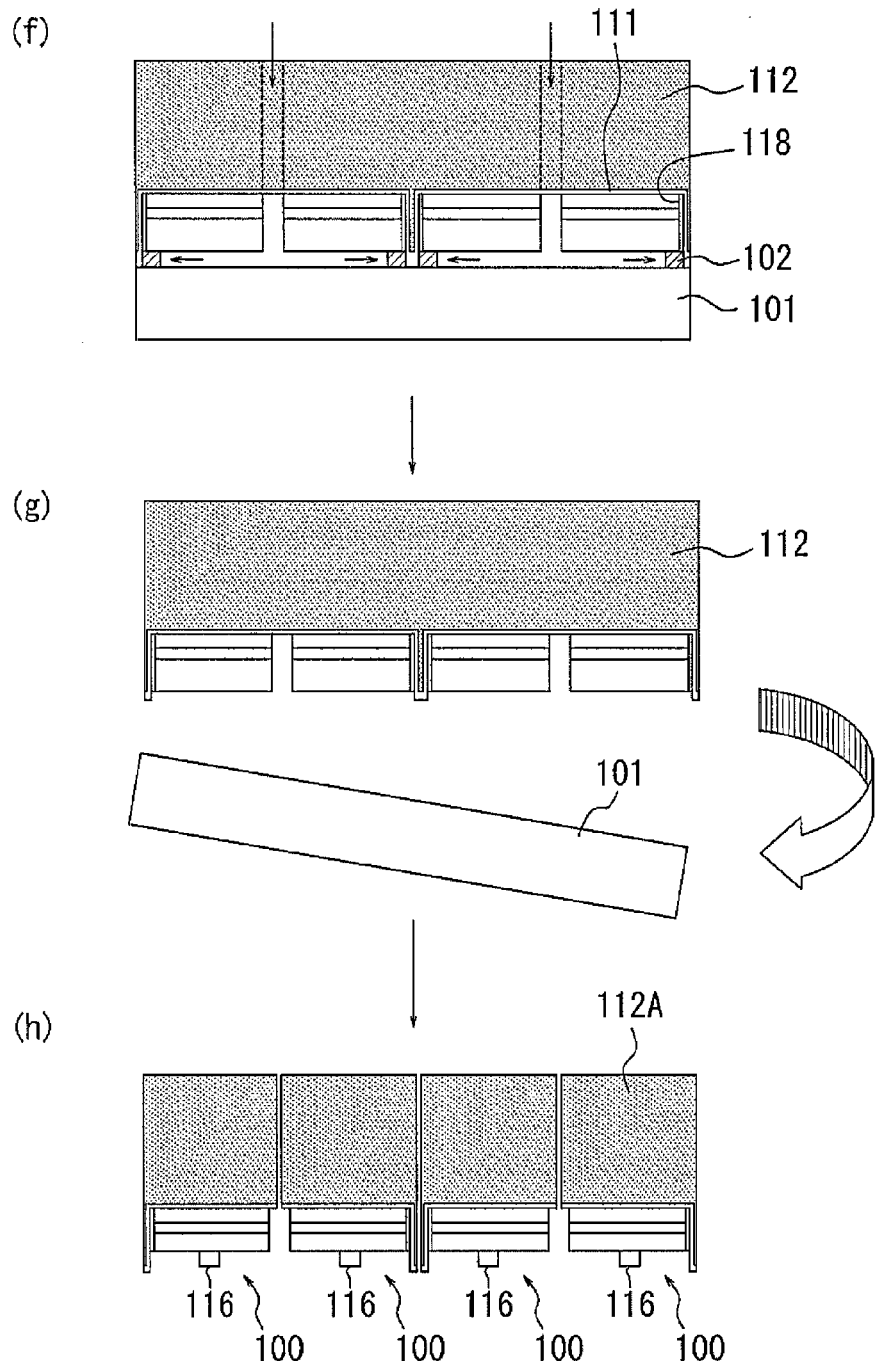
FIGS. 1C(f) to 1C(h) are cross-sectional views schematically illustrating steps of a method of manufacturing the vertically structured Group III nitride semiconductor LED chips 100 according to an embodiment of the present invention, subsequent to the steps in FIGS. 1B(d) and 1B(e).

Next, a third step is performed to form a conductive support body for integrally supporting the plurality of semiconductor structures. In this embodiment, first, as shown in FIG. 2(b), alternate lines in the longitudinal direction of the grooves 108 in a grid pattern are filled with resin 110. Thus, one of the surfaces of each semiconductor structure 107 is covered with the resin 110. Subsequently, an insulating film 118 is formed on the three surfaces of each semiconductor structure 107, which are not covered with the resin 110. After that, as shown in FIG. 1(c), plating seed layers 111 are formed on surfaces of the semiconductor structures 107, the surface of the resin 110, and the exposed bottom of the grooves 108. At that time, the plating seed layers 111 are also formed on the surface of the insulating films 118. Alternatively, only one side surface of each of the semiconductor structures 107 may be covered with the resin 110 after the insulating films 118 are formed on the three side surfaces. Further, in the actual process, it is difficult to form the insulating film exclusively on the side surfaces even by photolithography. Therefore, while not illustrated, the insulating film is preferably formed to extend from the side surfaces at least to part of the surface of each semiconductor structure 107 (the peripheral portions of the surface which are adjacent to the side surfaces).

Next, resin pillars 109 extending upward from the surface of the plating seed layers 111 on the resin 110 are formed at a given position above the surface of the resin 110, in the position shown in FIG. 2(b) in this embodiment. After that, as shown in FIG. 1(d), a conductive support body 112 is grown on the plating seed layers 111 by plating. Here, as shown with the halftone dots in FIG. 2(b), grooves 108 which are not filled with the resin 110 are filled with the same material as the conductive support body 112, and the concerned portions are referred to as embedded parts 113. Namely, in this embodiment, the conductive support body also serves as the embedded parts 113.

After that, as shown in FIG. 1 (e), the resin pillars 109 are removed, thereby forming through-holes 114 in the conductive support body 112. Further, portions of the plating seed layers and the resin 110 that are right under the through-holes 114 are removed via the through-holes 114, thereby forming cavities 115 in the grooves 108 having been filled with the resin 110. Consequently, the through-holes 114 are provided in portions of the conductive support body 112, located above the grooves 108 in which the cavities 115 are formed, in communication with the cavities 115.

Next, a fourth step is performed to remove the lift-off layer 102 using a chemical lift-off process. In this embodiment, one side surface 117A of each semiconductor structure 107 faces one of the grooves 108 in which the cavities 115 are formed, and the other three side surfaces 117B and 117C face the grooves 108 filled with the embedded parts 113. In other words, the embedded parts 113 are formed in grooves so as to cover all of the other three side surfaces 117B and 117C of each semiconductor structure 107. An etchant is supplied only to the grooves 108 in which the cavities 115 are formed, via the through-holes 114 and is not supplied to the grooves 108 filled with the embedded parts. Accordingly, as shown by the arrows in FIG. 2(c) and FIG. 1(f), the lift-off layer 102 is etched from the one side surface 117A of each semiconductor structure 107 toward the opposite side surface 117C. Specifically, the embedded parts 113 serve to allow an etchant to be supplied only to the one side surface 117A of the four side surfaces of each semiconductor structure 107, which is firstly etched, and to inhibit the etchant from being supplied to the other three side surfaces 117B and 117C.

In this embodiment, even after the lift-off layer 102 is removed, the growth substrate 101 is not separated from the semiconductor structures 107, since the plating seed layers 111 right under the embedded parts 113 are in contact with the growth substrate 101. With this being the case, as shown in FIG. 1(g), regions of the plating seed layers 111 that are in contact with the growth substrate 101 are removed to separate the growth substrate 101.

Finally, the conductive support body 112 is divided, for example, by being cut between the semiconductor structures 107 along the broken lines in FIG. 2(d), thereby singulating the plurality of LED chips 100 having the respective semiconductor structures 107 each supported a conductive support body 112A obtained by the division, as shown in FIG. 1(h). Further, upper electrodes 116 are formed on the separation side of the semiconductor structures 107.

The inventors of the present invention found that cracks can be substantially prevented from being formed in the semiconductor structures 107 by supplying an etchant through the cavities 115 thereby etching the lift-off layer 102 in one direction from one side surface 117A of each semiconductor structure 107 toward the side surface 117C opposite to the foregoing side surface.

The technical meaning of the present invention will be described below with the operation and effects. The inventors made various studies on the form of crack spots formed at a center region of the semiconductor structures. When an etchant is supplied from the peripheral portion of the semiconductor structures as in PTL 1, the lift-off layer is etched from the peripheral portion to the center portion. In this case, it was found that the local stresses are applied to the dissolution front portion where the semiconductor structures are detached from the growth substrate, that is, the boundary region between a portion of each semiconductor structure, which is attached to the growth substrate with the lift-off layer therebetween and a portion thereof which is detached from the growth substrate, thus forming cracks. When the etching on the lift-off layer is about to be completed, the lift-off layer still remains at the center portion, which leads to the formation of cracks due to stresses concentrated at the center portion.

On the other hand, in this embodiment, the process of etching, and the operation and effects of the etching are as follows. When the lift-off layer is etched first from only the one side surface 117A of each semiconductor structure 107, the above dissolution front portion translates from the side surface 117A to the opposite side surface 117C, remaining in a straight line. Therefore, stresses can be prevented from being concentrated at the center portion of the semiconductor structures 107 in the final stage where etching of the lift-off layer 102 is completed. Consequently, crack spots can be prevented from being formed at the center portion of the semiconductor structures 107. Further, since etching is performed in one direction, stresses are not concentrated at the corners. Accordingly, X-shape cracks, which are greatly extended from the corners to the center portion, can also be prevented from being formed.

Further, in this embodiment, the transverse cross-sectional shape of the semiconductor structures is not necessarily circular or rounded at the corners but can be quadrangular. This can reduce the loss of the effective area per wafer. In other words, the combined effects of the suppression of crack formation and the increase in the effective area can increase the yield per wafer.

Figure 3:
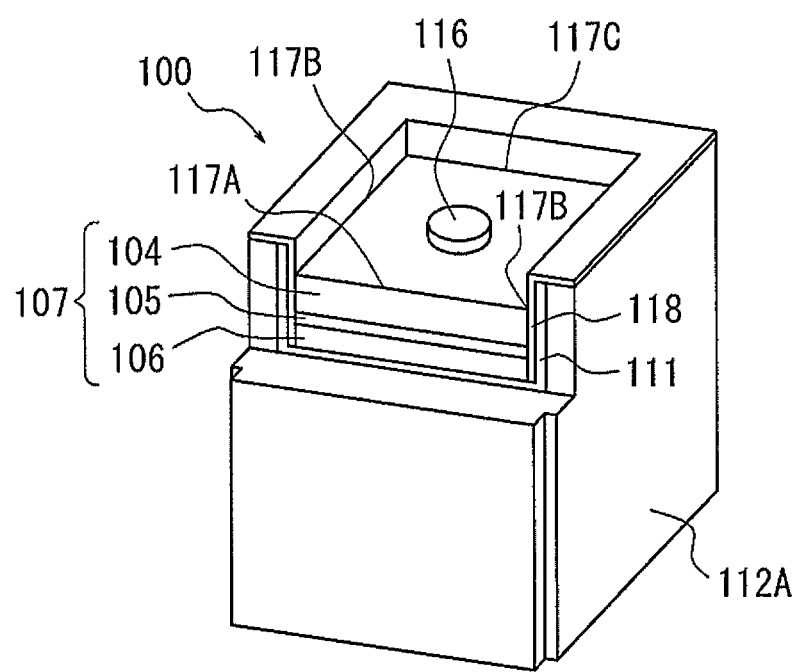
FIG. 3 is a perspective view schematically illustrating one of singulated vertically structured Group III nitride semiconductor LED chips 100 according to an embodiment of the present invention.

FIG. 3 is a schematic perspective view of a vertically structured Group III nitride semiconductor LED chip 100 which can be obtained by the above manufacturing method according to the present invention. The LED chip 100 has the following features. The LED chip 100 includes a conductive support body 112A and a semiconductor structure 107 having a nearly quadrangular transverse cross-sectional shape, which includes a second conductivity type semiconductor layer 106 provided on part of the conductive support body 112A, a light emitting layer 105 provided on the second conductivity type semiconductor layer 106, and a first conductivity type semiconductor layer 104 provided on the light emitting layer 105. The first conductivity type is different from the second conductivity type. Further, the conductive support body 112A covers three of the four side surfaces of the semiconductor structure 107, that is, side surfaces 117B and a side surface 117C. The side surface 117A is exposed. Note that there are an insulating film 118 and a plating seed layer 111 between the three side surfaces and the conductive support body 112A. In the LED chip 100, the conductive support body 112A functions as a lower electrode and is paired with an upper electrode 116 provided on the semiconductor structure 107.

(First Step)

A sapphire substrate or an AlN template substrate in which an AlN film is formed on a sapphire substrate is preferably used as the growth substrate 101. The growth substrate may be selected depending on the kind of the lift-off layer to be formed, the composition of Al, Ga, and In of the semiconductor structure laminate made of a Group III nitride semiconductor, the quality of LED chips, the cost, and the like.

In a chemical lift-off process, the lift-off layer 102 is preferably a buffer layer made of a metal other than Group III elements such as CrN or a nitride of such metal, since such a buffer layer can be dissolved by chemical selective etching. The lift-off layer 102 is preferably deposited by sputtering, vacuum deposition, ion plating, or MOCVD. Typically, the thickness of the lift-off layer 102 is approximately 2 nm to 100 nm.

The first conductivity type and the second conductivity type of the semiconductor structure laminate 103 may be n-type and p-type, respectively or opposite thereto. The first conductivity type Group III nitride semiconductor layer 104, the light emitting layer 105, and the second conductivity type Group III nitride semiconductor layer 106 can be epitaxially grown on the lift-off layer 102 by MOCVD.

Note although this embodiment shows a Group III nitride semiconductor LED chip, the material or the layer structure of the semiconductor structure of a semiconductor device of the present invention are not limited in particular as long as the semiconductor device is manufactured by a chemical lift-off process. If the semiconductor structure includes a light emitting layer, the semiconductor device is an LED, and if not, it is another type of semiconductor device. The semiconductor structure 107 may be made of, for example, an AlInGaN-based or AlInGaPAs-based Group III-V material or a Group II-VI material such as ZnO. Typically, the thickness of the semiconductor structure 107 is approximately 0.5 μm to 20 μm.

(Second Step)

It is preferable to employ dry etching for partially removing the semiconductor laminate 103. This is because the end points of etching of the semiconductor laminate 103 made of a Group III nitride semiconductor layer can be reproducibly controlled. Further, the lift-off layer 102 cannot be etched with an etchant in a later step if the semiconductor laminate 103 is continuous. Accordingly, the partial removal of the semiconductor laminate is performed at least until the growth substrate is partially exposed. This embodiment described above presents an example of removing the lift-off layer at the bottom of the grooves 108 to expose the whole growth substrate 101.

In the present invention, the transverse cross-sectional shape of the semiconductor structures 107 is not limited in particular as long as it is nearly quadrangular, yet it is preferably rectangular in terms of the effective area. "Nearly quadrangular shape" here includes, for example, a quadrangle having corners that are rounded or beveled to some degree, besides a quadrangle. Note that in terms of keeping etching in one direction, the side surface 117A to be first supplied with an etchant necessarily has some straight region so as not to inhibit the effect of suppressing crack formation in the present invention.

The length of one side of the semiconductor structures 107 is typically 250 μm to 3000 μm. Further, the width of the grooves 108 is preferably within the range of 40 μm to 200 μm, and more preferably within the range of 60 μm to 100 μm. The width of 40 μm or more allows the etchant to be supplied to the grooves 108 smoothly enough, whereas the width of 200 μm or less can minimize the loss of light emitting area.

(Third Step)

Figure 4:
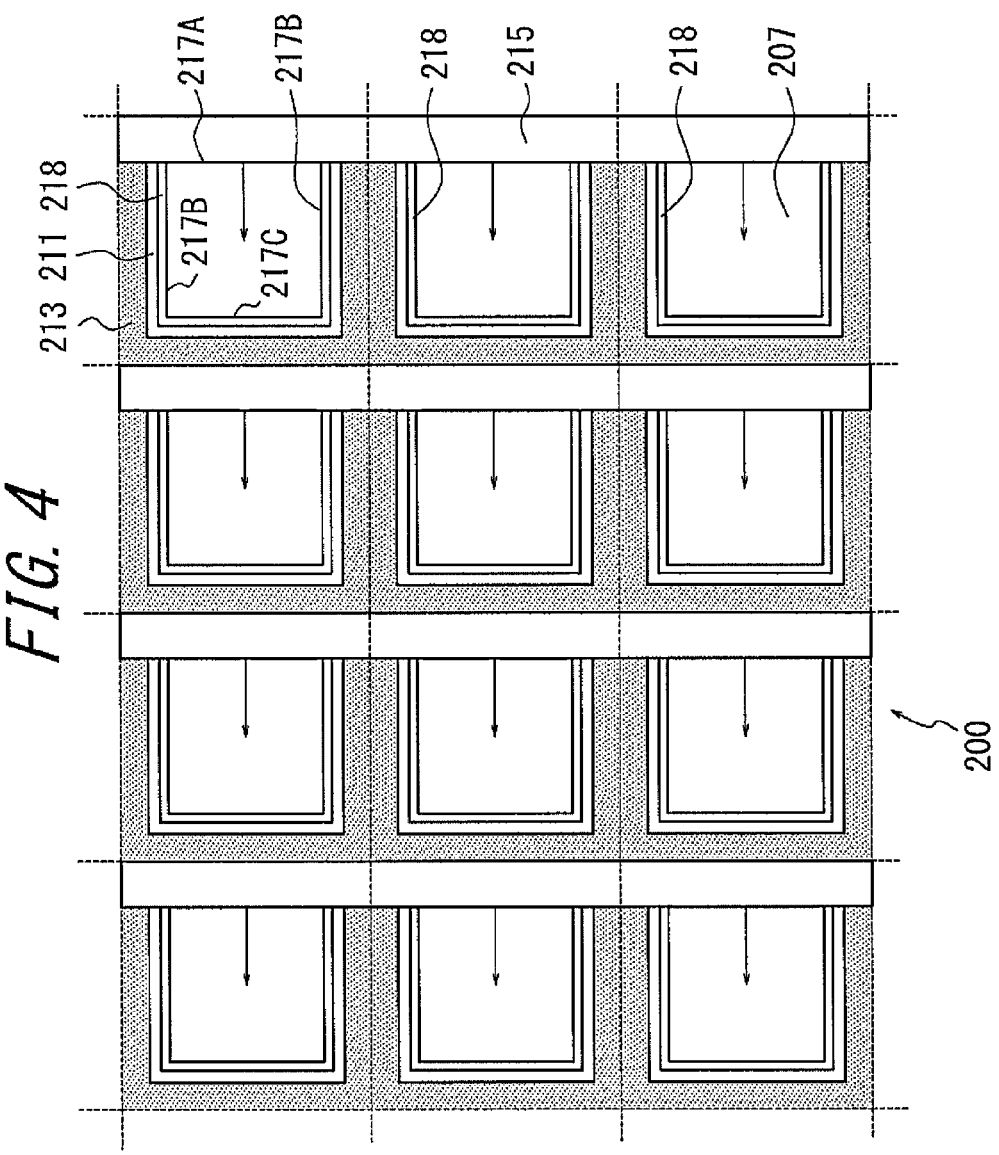
FIG. 4 is a transverse cross-sectional view schematically illustrating one step of a method of manufacturing vertically structured Group III nitride semiconductor LED chips 200 according to another embodiment of the present invention.

This embodiment shows an example of filling alternate lines of the grooves 108 with the resin 110 in the longitudinal direction as shown in FIG. 2(b); however, the position of the resin 110 provided in each groove 108 for forming the cavities 115, is not limited in particular as long as only one side surface of each semiconductor structure has a cavity, and the other three side surfaces are covered with the embedded parts 113. For example, the resin may be provided only on the left half of each groove in the longitudinal direction. FIG. 4 is a transverse cross-sectional view schematically illustrating a step in a method of manufacturing LED chips 200 according to another embodiment of the present invention showing the above example, and corresponds to FIG. 2(c). Also in this embodiment, each cavity 215 is formed only on the one side surface 217A of each semiconductor structure 207, and the other side surfaces 217B and 217C are covered with the embedded parts 213 with an insulating film 218 and a plating seed layer 211 therebetween; accordingly, etching is performed in the direction of the arrows, which allows etching on the semiconductor structures 207 in one direction.

Further, although an example of forming cavities in the grooves in the longitudinal direction is shown, the cavities may be formed in grooves in the longitudinal direction and the lateral direction in a mixed way so that each cavity is formed on one different side surface of each light emitting structure.

The conductive support body 112 can serve also as a lower electrode. The conductive support body 112 can be formed by a plating process such as wet plating or dry plating. For example, when Cu or Au electroplating is employed, Cu, Ni, Au, or the like can be used for a surface of the plating seed layer 111 (on the conductive support body side). In that case, a metal having sufficient adhesion to the semiconductor structures 107 and the insulating films 118, for example, Ti or Ni is preferably used on the growth substrate side (semiconductor structure side) of the plating seed layers 111. Note that an adhesion layer made of a metal or an insulator may be additionally provided between the growth substrate 101 and the plating seed layers 111. The adhesion layer is such that it has adhesion to the growth substrate 101 and the plating seed layers 111 and is not etched in a subsequent chemical lift-off step, but can be separated or removed after the chemical lift-off step. The adhesion layer may be one or more layers made of, for example, Ti, Al, Ni, Cr, Pt, or Au or an alloy thereof; alternatively one or more layers of SiO$_2$ or SiN may be used as the adhesion layer. The conductive support body 112 on the semiconductor structures 107 typically has a thickness of approximately 80 μm to 300 μm. Here, a two-step plating may be performed by forming a plating layer having a smaller thickness of approximately 10 μm to 50 μm on the semiconductor structures 107 and forming another plating layer having a larger thickness of approximately 80 μm to 200 μm. On this occasion, the second plating may be performed after the step of removing the lift-off layer (fourth step).

Further, in cases where the conductive support body 112 is formed by a joining method, a conductive silicon substrate, a CuW alloy substrate, a Mo substrate, or the like in which through-holes 114 are previously formed, is suitable in terms of the thermal expansion coefficient and the thermal conductivity. In such cases, the two substrates are joined such that the through-holes thereof are aligned. However, if the conductive support body is formed by a joining method, it is difficult to previously form the embedded parts 113 in the substrates to be joined together. Therefore, the conductive support body 112 is preferably formed by a plating process. Note that the second plating in the above two-step plating can easily be replaced by a joining method.

The through-holes 114 preferably has a rectangular shape or a circular shape 40 μm to 100 μm in one side length or in diameter in terms of supply efficiency of the etchant. The plurality of semiconductor structures 107 are integrally supported only by the conductive support body 112 after the separation of the growth substrate (FIG. 1(g)) until the singulation (FIG. 1(h)); therefore, the conductive support body 112 should be sized and positioned such that a certain degree of strength can be ensured.

As shown in FIG. 3, the insulating films 118 are formed on the three side surfaces 117B and 117C covered with the conductive support body 112A. Since the plating seed layers 111 are made of a metal, if they are directly formed on the side surfaces of the semiconductor structures 107, the device does not work. The insulating films 118 can be made of, for example SiO$_2$ or SiN. Further, a reflection layer may additionally be formed between the insulating films 118 and the plating seed layers 111. In the above embodiment, the plating seed layers 111 are formed after forming the insulating films 118; alternatively, the plating seed layers 111 may be formed without the formation of the insulating films 118. In the latter case, gaps may be formed by dry etching or the like between the semiconductor structures 107 and the plating seed layers 111 after chemical lift-off, and the insulating films 118 can be formed in those gaps.

While not shown in the drawings, in the third step, ohmic electrode layers are preferably formed to be in contact with the plurality of second conductivity type Group III nitride semiconductor layers 106, between the main surface of the second conductivity type Group III nitride semiconductor layer 106 of each of the plurality of semiconductor structures 107 and the plating seed layers 111. More preferably, additional reflection layers are formed between the ohmic electrode layers and the plating seed layers; alternatively, the ohmic electrode layers also serves as reflection layers. These layers can be formed by a dry deposition process such as vacuum vapor deposition, ion plating, or sputtering.

The foregoing ohmic electrode layers can be formed of a high work function metal, for example, a noble metal such as Pd, Pt, Rh, Au, or Ag; or Co or Ni. Such ohmic electrode layers can be used also as reflection layers since Rh and the like have high reflectivity. However, when the emission wavelengths are in the visible range, a layer of Ag, Al, or the like is preferably used. Whereas, when the emission wavelengths are in the ultraviolet range, a layer of Rh, Ru, or the like is preferably used.

In the fourth step, an etchant is supplied to the cavities 115 of the grooves 108 through the through-holes 114. Accordingly, prior to the fourth step, the embedded parts 113 are preferably formed in the grooves 108 so as to allow supply of the etchant only to the one side surface 117A of the four side surfaces, where etching starts, of each semiconductor structure 107 and to inhibit supply of the etchant to the opposite side surface 117C and the other two opposite side surfaces 117B. The formation of such embedded parts 113 allows etching of the lift-off layer 102 to start only from the one side surface 117A.

As described above, this embodiment shows an example of providing the embedded parts 113 in the grooves 108 so as to cover all of the three side surfaces 117B and 117C, yet the present invention is not limited thereto. For example, the embedded parts may be provided in the grooves 108 so as to cover the opposite two side surfaces 117B, whereas the grooves facing the side surfaces 117C may be empty or may be filled with a material different from that of the conductive support body. Examples of the filling include a resin that remains due to the absence of any pathway for introducing a solution in which the resin is dissolved, such as acetone. If there is no pathway for the introduction of acetone, the resin cannot be removed before the removal of the lift-off layer, so that the etchant is not supplied to the grooves facing the side surfaces 117C. Even with such a structure, the embedded parts of the two opposite side surfaces 117B inhibit the supply of the etchant to the side surfaces 117C, and the etchant supply is limited to the path from the through-holes 114 to the cavities 115, which allows etching of the lift-off layer 102 to start only from the one side surfaces 117A.

However, if the grooves facing side surfaces 117C are empty, the etchant flows into such grooves upon completion of the etching of the lift-off layer 102, which would cause cracks at the edge of the surface of the semiconductor structures 107 on the side surface 117C side.

For this reason, it is preferable that such grooves are not empty but filled.

Figure 5:
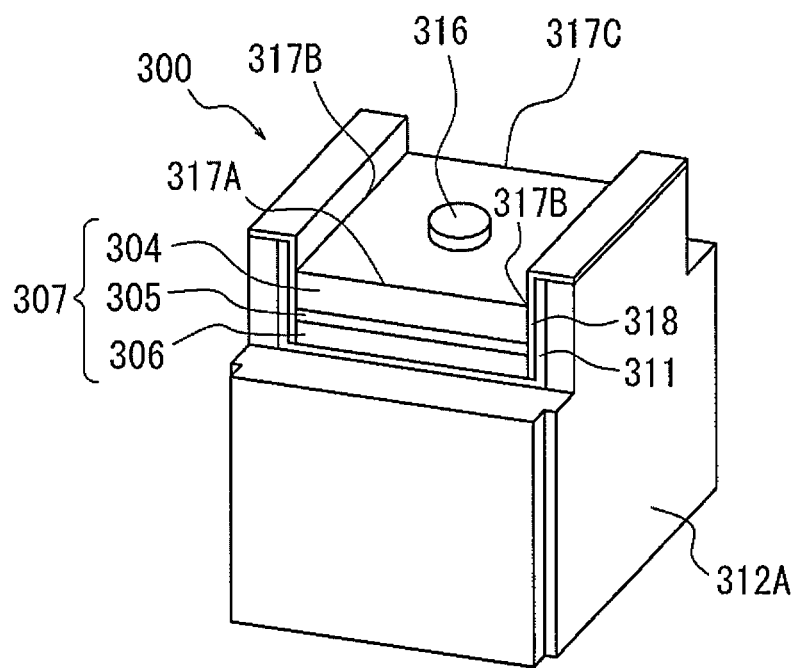
FIG. 5 is a perspective view schematically illustrating one of singulated vertically structured Group III nitride semiconductor LED chips 300 according to yet another embodiment of the present invention.
Figure 6:
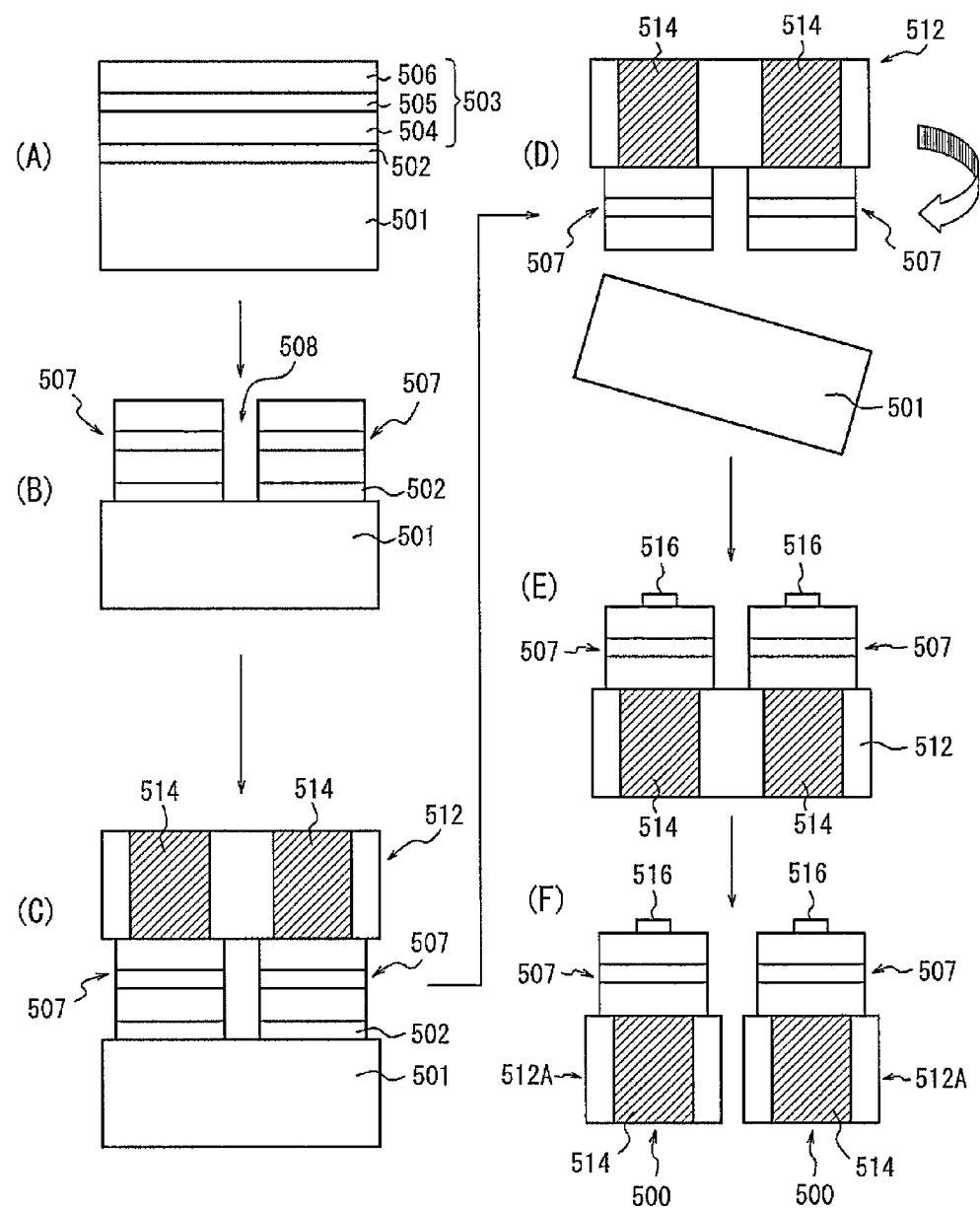
FIG. 6(A) to 6(F) are vertical cross-sectional views schematically illustrating steps of a conventional method of manufacturing vertically structured Group III nitride semiconductor LED chips 500.

FIG. 5 is a perspective view schematically showing a vertically structured Group III nitride semiconductor LED chip 300 of the present invention, obtained by such a manufacturing method in which the embedded parts 113 are provided in the grooves 108 so as to cover only the two opposite side surfaces 117B. The LED chip 300 includes a conductive support body 312A and a semiconductor structure 307 having a nearly quadrangular transverse cross-sectional shape, which includes a second conductivity type semiconductor layer 306 provided on part of the conductive support body 312A, a light emitting layer 305 provided on the second conductivity type semiconductor layer 306, and a first conductivity type semiconductor layer 304 provided on the light emitting layer 305. The first conductivity type is different from the second conductivity type. Further, the conductive support body 312A covers two opposite side surfaces 317B of the four side surfaces of the semiconductor structure 307. The side surfaces 317A and 317C are exposed. Note that there are an insulating film 318 and a plating seed layer 311 between the side surfaces 317B and the conductive support body 312A. In the LED chip 300, the conductive support body 312A functions as a lower electrode and is paired with an upper electrode 316 provided on the semiconductor structure 307.

The resin pillars 109 and the resin 110 in FIGS. 1(d) to 1(e) are removed using a liquid in which resins are soluble, for example, acetone, alcohols, or the like. The liquid may be heated to a temperature equal to or lower than the boiling point. At this point, the plating seed layers 111 between the resin pillars 109 and the resin 110 are not dissolved in acetone or the like; however, the plating seed layers 111 are easily removed since they are extremely thin as compared with the resin 110 and the pillars 109. The removal may be performed mechanically or may be performed by metal etching or the like. After the resin pillars 109 are removed, the plating seed layers are removed, and the resin 110 thereunder is also removed with the same liquid; thus, the through-holes 114 are in communication with the cavities 115. Naturally, the plating seed layers 111 may be partially removed to expose the resin 110, and the resin pillars 109 may be formed directly on the exposed resin 110.

(Fourth Step)

The fourth step is preferably performed by the above described typical chemical lift-off process or photochemical lift-off process. When the lift-off layer is made of CrN, examples of possible etchants are publicly known selective etchants including a diammonium cerium nitrate solution and a potassium ferricyanide-based solution. Whereas when the lift-off layer is made of ScN, examples of the etchants include hydrochloric acid, nitric acid, and organic acid.

After lift-off, the growth substrate 101 is preferably attached to the conductive support body 112 with the plating seed layers 111 therebetween. This can prevent the formation of not only center cracks and X-shape cracks but also edge cracks formed at the portion where etching ends (on the side surface 117C side). Accordingly, it is preferable that the plating seed layers 111 are unetchable with the etchant used for lift-off or etchable therewith to an extent where the growth substrate can remain attached to the plating seed layers 111 even after the lift-off.

The growth substrate 101 can be mechanically peeled or can be separated by chemically removing part of the plating seed layers 111 by applying a specific etchant to the portions where the plating seed layers 111 are directly attached to the growth substrate 101 or attached thereto with a connection layer therebetween. Examples of an etchant suitable for chemical peeling include, for example, a BHF solution ($NH_4F/HF/H_2O$). However, the BHF solution possibly etches the metal of an unintended area. On this account, a material (metal, an insulating film, resin, or the like) different from that of the plating seed layers 111 may be additionally formed as the above connection layer for temporary attachment between the plating seed layers 111 and the growth substrate 101. Note that the material is such that it can maintain the attachment even after the lift-off using the etchant, and can be removed or selectively etched by a different method.

Further, the surfaces of the semiconductor structures 107 that have been exposed by the fourth step are preferably cleaned by wet washing. Subsequently, the semiconductor structures can be etched for a predetermined amount by dry etching and/or wet etching. With this being the case, as shown in FIG. 3 and FIG. 5, the top surface of the semiconductor structures 107 is lower than the conductive support body 112A.

Further, n-type ohmic electrodes and bonding pad electrodes are formed as upper electrodes by lift-off using resists as masks. The material of the electrodes may be Al, Cr, Ti, Ni, Pt, Au, or the like. A material of Ti, Pt, Au, or the like is deposited as cover layers on the ohmic electrodes and the bonding pads to reduce wiring resistance and improve adhesion of the wire bonding. Note that the side surfaces and the surface of the semiconductor structures 107 (except for the bonding pad surfaces) that are exposed may be provided with protective films (insulating films) made of $SiO_2$, SiN, or the like.

(Fifth Step)

In the fifth step, cutting is performed between the light emitting structures 107 using, for example, a blade dicer or a laser dicer. For example, the margin of cutting using a laser dicer is approximately 20 µm to 40 µm for the width 40 µm to 200 µm of the grooves 108; accordingly, the width of the conductive support bodies 112A covering the semiconductor structures 107 is approximately 90 µm or less.

The above shows examples of typical embodiments, and the present invention is not limited to those embodiments. Various modifications may be made without departing from scope of the claim of the invention.

EXAMPLES

Example

An LED chip shown in FIG. 3 was manufactured by the method shown in FIGS. 1A to 1C and FIGS. 2A and 2B. Specifically, first, a Cr layer was formed on a sapphire substrate by sputtering and was heat-treated in an atmosphere containing ammonia, thereby forming a lift-off layer (CrN layer, thickness: 18 nm). After that, an n-type Group III nitride semiconductor layer (GaN layer, thickness: 7 µm), a light emitting layer (InGaN-based MQW layer, thickness: 0.1 µm), and a p-type Group III nitride semiconductor layer (GaN layer, thickness: 0.2 µm) were sequentially stacked to form a semiconductor laminate. The semiconductor laminate was then partially removed by dry etching to partially expose the sapphire substrate to form grooves in a grid pattern, thereby forming a plurality of separate island-like semiconductor structures each having a square transverse cross-sectional shape. The width W of the semiconductor structures was 1200 µm, and the devices were arranged in a matrix. The pitch between the devices was 1300 µm; accordingly, the groove width was 100 µm.

An ohmic electrode layer (Ag, thickness: 0.2 µm) was formed on the p-type Group III nitride semiconductor layer by EB vapor deposition. Further, an insulating film ($SiO_2$, thickness: 0.6 µm) was formed by plasma chemical vapor deposition, part of the insulating film other than the part covering the three side surfaces of each semiconductor structure that are not covered with resin and covering part of the semiconductor structure was removed by etching. After that, in order to provide cavities for supplying an etchant, resin (photoresist) was provided in some of the grooves using photolithography as shown in FIG. 2(b). Subsequently, plating seed layers (Ti/Ni/Au, thickness: 0.02 µm/0.2 µm/0.6 µm, respectively) were formed by sputtering on a surface of the semiconductor structures (specifically, on the surface of the above ohmic electrode layers and the insulating films), the surfaces of the resin, and the exposed bottom and side surfaces of the grooves.

Next, 100 µm square pillars for forming through-holes were formed using resin (thick film photoresist, thickness: 30 µm) by photolithography at the positions shown in FIG. 2(b). After that, Cu (thickness: 100 µm on the semiconductor laminate) was deposited as a conductive support body on the plating seed layers by plating. The plating was electroplating using a copper sulfate-based electrolyte solution, where the temperature of the solution was in the range of 25° C. to 30° C., and the deposition rate was 35 µm/hr. Thus, embedded parts of Cu plating were formed in the grooves in which the plating seed layers had been formed. Here, regions provided with the pillars for forming through-holes were not plated with Cu, and through-holes were formed by removing the pillars using acetone to lead to the grooves provided with the resin through the conductive support body. After the pillars were removed using acetone, the plating seed layers right under the through-holes were removed using a HF-added Au etchant. Via those through-holes, the resin in the grooves were subsequently removed using acetone, thereby forming cavities.

After that, the lift-off layer was removed by a chemical lift-off process using a Cr selective etching solution as an etchant. Meanwhile, the etchant was supplied to the lift-off layer through the above through-holes due to immersion in the etchant, and the lift-off layer was first etched only from one side surface of each semiconductor structure. Subsequently, the sapphire substrate side was slightly dipped in a BHF solution, thereby dissolving Ti in a portion of the plating seed layers attached to the sapphire substrate at the bottom of the grooves. Thus, the sapphire substrate was separated.

The semiconductor structures were observed after lift-off with an optical microscope and the formation of macro/microcracks was examined. The number of the examined semiconductor structures was 380,000 and no macrocracks/microcracks were observed.

After that, the exposed n-type Group III nitride semiconductor layer was etched 3 µm in the thickness direction by dry etching, and besides, the surface thereof was made rough using a KOH solution. N-type ohmic electrodes were then formed on the n-type Group III nitride semiconductor layer by sputtering using Ti/Al, and pad electrodes were also formed using Ni/Au. Subsequently, an insulating film ($SiO_2$, thickness: 0.3 µm) was formed on the surface and the side surfaces of the semiconductor structures that were exposed, and on the exposed surface of the embedded parts by plasma chemical vapor deposition. The insulating films on the pad electrodes were partially removed by etching to expose the top of the pad electrodes.

The conductive support portion having the embedded parts was cut using a laser dicer, thereby forming light emitting devices in which three side surfaces of the four side surfaces of each semiconductor structure are covered with the embedded parts.

Comparative Example

LED chips were manufactured by a conventional manufacturing method shown in FIGS. 6(A) to 6(F) and FIGS. 7(A) and 7(B). Specifically, first, a semiconductor laminate as in Example was formed on a sapphire substrate and the semiconductor laminate was then partially removed by dry etching to partially expose the sapphire substrate to form grooves, thereby forming a plurality of separate island-like semiconductor structures each having a 1000 µm diameter circular transverse cross-sectional shape. The device pitch between the semiconductor structures was 1250 µm.

An ohmic electrode layer as in Example was formed on the p-type layer of each separate semiconductor structure, and all the grooves were then filled with photoresist. Meanwhile, an opening was formed in the portion of the p-type ohmic electrode layer of each semiconductor structure, and a plating seed layer (Ni/Au/Cu) was formed therein. Next, pillars of thick film resists were formed to prevent a Cu film from being formed in plating to be described. The pillars were formed on the grid lines surrounding the semiconductor structures as shown in FIG. 7(A). Note that portions of the connection layer on the pillar formation positions were previously removed by etching.

Next, electroplating with Cu was performed using a copper sulfate-based electrolyte solution to form a 80 μm conductive support body. The solution temperature was in the range of 25° C. to 30° C., and the deposition rate was 25 μm/hr. Subsequently, the pillars and the resists provided in the grooves were removed using acetone, thereby forming through-grooves penetrating the support body. Note that the through-grooves shown in FIG. 7(A) were formed on the four sides with a width of 70 μm and a length of 900 μm.

After that, the lift-off layer was removed by a chemical lift-off process using a Cr selective etching solution as an etchant, thereby separating the sapphire substrate. Meanwhile, the lift-off layer was etched from the peripheral portion of each semiconductor structure to the center portion thereof. Accordingly, the lift-off layer at the center portion was removed in the end.

The semiconductor structures were observed after lift-off with an optical microscope and it was found that X-shaped cracks widely extending from the corners to the center portion were formed in 38 out of 1900 of the examined semiconductor structures (incidence was 2.0%) in Comparative Example and that crack spots were formed in the central region of 1045 of the semiconductor structures, and the incidence was 55.0%.

INDUSTRIAL APPLICABILITY

The present invention can provide a high quality semiconductor device in which not only X-shape cracks extending from the vicinity of the corners of semiconductor structures to the center portion thereof, but also crack spots at the center portion can be prevented from being formed and to provide a method of producing the semiconductor device.

REFERENCE SIGNS LIST

100: Group III nitride semiconductor LED chip
101: Growth substrate
102: Lift-off layer
103: Semiconductor laminate
104: First conductivity type Group III nitride semiconductor layer
105: Light emitting layer
106: Second conductivity type Group III nitride semiconductor layer
107: Semiconductor structure
108: Groove
109: Resin pillar (Pillar)
110: Resin
111: Plating seed layer
112: Conductive support body
112A: Conductive support body after cutting (singulation)
113: Embedded part
114: Through-hole
115: Cavity
116: Upper electrode
117A: Side surface (Side surface to be first supplied with etchant)
117B: Two opposite side surfaces
117C: Side surface (Side surface to which etchant reaches in the end of etching)
118: Insulating film

The invention claimed is:

1. A method of manufacturing a semiconductor device, comprising:
    a first step of forming a semiconductor layer on a growth substrate with a lift-off layer therebetween;
    a second step of partially removing the semiconductor layer to form grooves in a grid pattern such that the growth substrate is partially exposed at the bottom of the grooves, thereby forming a plurality of semiconductor structures each having a nearly quadrangular transverse cross-sectional shape;
    a third step of forming a conductive support body for integrally supporting the plurality of the semiconductor structures;
    a fourth step of removing the lift-off layer using a chemical lift-off process; and
    a fifth step of dividing the conductive support body between the semiconductor structures thereby singulating a plurality of semiconductor devices having the respective semiconductor structures supported by the conductive support body,
    wherein in the fourth step, in supplying an etchant to the grooves via through-holes in the conductive support body, the through-holes being provided in a portion above the grooves, the lift-off layer is etched from only one of the side surfaces of each of the semiconductor structures.

2. The method of manufacturing a semiconductor device according to claim 1, wherein prior to the fourth step, supplying the etchant only to the one side surface, which is firstly etched, of the four side surfaces of each semiconductor structure, and
    forming embedded parts in the grooves for inhibiting the etchant from being supplied to the other three side surfaces of each semiconductor structure.

3. The method of manufacturing a semiconductor device according to claim 2, wherein the conductive support body also serves as the embedded parts.

4. The method of manufacturing a semiconductor device according to claim 2, wherein the embedded parts are provided in the respective grooves so as to cover all of the said other three side surfaces of each semiconductor structure.

5. The method of manufacturing a semiconductor device according to claim 2, wherein the embedded parts are provided in the respective grooves so as to cover opposite two side surfaces of the said other three side surfaces of each semiconductor structure.

6. The method of manufacturing a semiconductor device according to claim 3, wherein in the third step, the conductive support body is formed by plating.

7. The method of manufacturing a semiconductor device according to claim 3, wherein the embedded parts are provided in the respective grooves so as to cover all of the said other three side surfaces of each semiconductor structure.

8. The method of manufacturing a semiconductor device according to claim 3, wherein the embedded parts are provided in the respective grooves so as to cover opposite two side surfaces of the said other three side surfaces of each semiconductor structure.

9. The method of manufacturing a semiconductor device according to claim 6, the third step comprising:
    a step of filling a space in each groove, where the embedded parts are not formed, with resin;
    a step of growing a conductive support body also serving as the embedded parts, by plating on surfaces of the semiconductor structures, on a surface of the resin, and at the exposed bottom of the grooves;

a step of forming the through-holes in the conductive support body; and a step of removing the resin via the through-holes, thereby forming cavities in the portions of the grooves, and in the fourth step, supplying an etchant to the cavities in the grooves via the through-holes.

10. The method of manufacturing a semiconductor device according to claim 6, wherein the embedded parts are provided in the respective grooves so as to cover all of the said other three side surfaces of each semiconductor structure.

11. The method of manufacturing a semiconductor device according to claim 6, wherein the embedded parts are provided in the respective grooves so as to cover opposite two side surfaces of the said other three side surfaces of each semiconductor structure.

12. The method of manufacturing a semiconductor device according to claim 9, wherein the embedded parts are provided in the respective grooves so as to cover all of the said other three side surfaces of each semiconductor structure.

13. The method of manufacturing a semiconductor device according to claim 9, wherein the embedded parts are provided in the respective grooves so as to cover opposite two side surfaces of the said other three side surfaces of each semiconductor structure.

* * * * *